(12) United States Patent
Volkerink et al.

(10) Patent No.: US 7,707,468 B2
(45) Date of Patent: Apr. 27, 2010

(54) SYSTEM AND METHOD FOR ELECTRONIC TESTING OF MULTIPLE MEMORY DEVICES

(75) Inventors: Erik Volkerink, Palo Alto, CA (US); Duncan Gurley, San Jose, CA (US)

(73) Assignee: Verigy (Singapore) Pte. Ltd, Singapore (SG)

( * ) Notice: Subject to any disclaimer, the term of this patent is extended or adjusted under 35 U.S.C. 154(b) by 0 days.

(21) Appl. No.: 11/726,542

(22) Filed: Mar. 22, 2007

(65) Prior Publication Data
US 2008/0235537 A1 Sep. 25, 2008

(51) Int. Cl.
*G11C 29/00* (2006.01)
(52) U.S. Cl. ...................................................... 714/718
(58) Field of Classification Search ................... 714/718
See application file for complete search history.

(56) References Cited

U.S. PATENT DOCUMENTS

| | | | |
|---|---|---|---|
| 7,321,997 B2 * | 1/2008 | Zimmerman et al. ........ | 714/718 |
| 7,386,765 B2 * | 6/2008 | Ellis et al. ..................... | 710/52 |
| 7,395,476 B2 * | 7/2008 | Cowell et al. ................ | 714/734 |
| 2007/0011562 A1 * | 1/2007 | Alexander et al. .......... | 714/758 |
| 2007/0038907 A1 * | 2/2007 | Jeddeloh et al. ............. | 714/718 |
| 2007/0083705 A1 * | 4/2007 | Kuwashima et al. ........ | 711/112 |
| 2008/0022186 A1 * | 1/2008 | Co et al. ...................... | 714/763 |
| 2008/0098277 A1 * | 4/2008 | Hazelzet ...................... | 714/753 |

* cited by examiner

*Primary Examiner*—James C Kerveros
(74) *Attorney, Agent, or Firm*—Fay Kaplun & Marcin, LLP

(57) ABSTRACT

A testing device may include a memory controller managing a transfer of data; and a plurality of interface boards. Each interface board includes a controller buffer. Each controller buffer transfers data between the memory controller and at least one memory module. The memory controller tests the at least one memory module. The testing device is operable to test the at least one memory module independent of an operating rate of the at least one memory module. The memory controller receives operating data of the at least one memory module.

20 Claims, 5 Drawing Sheets

SYSTEM AND METHOD FOR ELECTRONIC TESTING OF MULTIPLE MEMORY DEVICES

BACKGROUND

Newly manufactured electronic devices are tested to create stimulus signals and capture responses. These measurements may be used to, for example, measure actual performance against expected performance. The proper operation of the electronic devices may then be proven or faults in the devices may be traced and repaired. In particular, memory modules including a plurality of memory devices are tested to ensure capabilities prior to introduction into markets. With advancements in memory device technology, the speeds in which the memory devices operate are increasing. Testing, repair, and programming of faster memory devices require difficult and expensive hardware investments to conventional testing devices when data rates increase above 400 Mhz. For example, additional testing hardware is required for these high rate devices.

Testing newly manufactured electronic devices on an individual basis is inefficient, both regarding time and costs. Testing systems have been created to test multiple electronic devices concurrently with common testing modules. However, the multiple electronic device testing systems also fall victim to the limitations of the individual testing devices when the operating speeds exceed a threshold rate. For example, conventional testing devices, both individual and multiple, are not scaling to increasing complex needs of improved memory devices. Difficult and expensive hardware investments are required for each site of the multiple electronic device testing system where a high operating rate electronic device is connected. Thus, there is a need to improve multiple electronic device testing systems to test multiple, newly manufactured electronic devices.

SUMMARY OF THE INVENTION

The present invention relates to a method and a testing device for electronically testing of multiple memory devices. The testing device may include a memory controller managing a transfer of data; and a plurality of interface boards. Each interface board includes a controller buffer. Each controller buffer transfers data between the memory controller and at least one memory module. The memory controller tests the at least one memory module. The testing device is operable to test the at least one memory module independent of an operating rate of the at least one memory module. The memory controller receives operating data of the at least one memory module inserted upon approval of the inventor]

DETAILED DESCRIPTION

Figure 1:
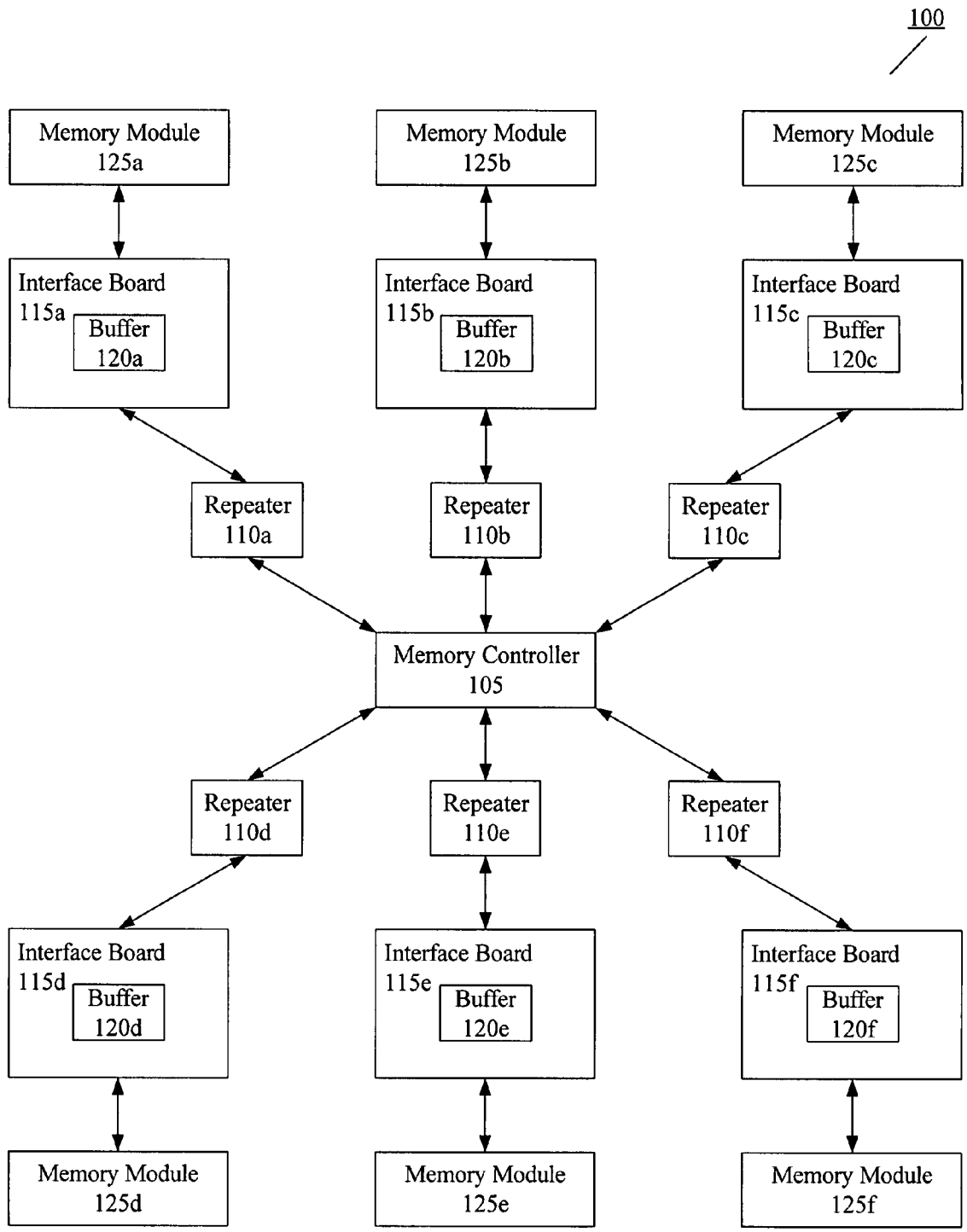
FIG. 1 shows a first exemplary embodiment of a system according to the present invention.

The present invention may be further understood with reference to the following description and the appended drawings, wherein like elements are referred to with the same reference numerals. The exemplary embodiments of the present invention provide a system and method for performing tests on multiple electronic devices such as memory devices. The exemplary embodiments of the present invention will be described with reference to the tests being conducted for memory modules using a testing device that includes advanced memory buffers (AMB) as a logical layer. It should be noted that those skilled in the art will understand that the present invention may be utilized to test any electronic device with increased operating rates where utilizing conventional testing equipment requires a difficult and expensive hardware investment.

Conventional testing devices may provide operating data of memory modules. However, with increased operating rates, the conventional testing devices require a difficult and expensive hardware investment to handle the increased operating rates. Furthermore, with conventional testing devices capable of testing multiple memory modules concurrently, each connection site attached to an increased operating rate memory module requires the hardware investment. The exemplary embodiments of the present invention improve the testing device to collect operating data for multiple memory modules having the increased operating rates.

FIG. 1 shows a first exemplary embodiment of a system 100 for performing an electronic test of memory devices according to the present invention. The system 100 may include a memory controller (MC) 105 that is electrically connected to multiple devices under test (DUT) such as the memory modules (MM) 125a-f. The electrical connection may be enhanced using repeaters 110a-f disposed between the MC 105 and each of the MMs 125a-f, respectively. Those skilled in the art will understand that the repeaters 110a-f receive weak or low-level signals and retransmit these signals at a higher level or power in order to cover longer distances. Thus, if the signals to be transmitted between the memory controller 105 and the MMs 125a-f are sufficiently strong (e.g., MC 105 and MM 125a are in close proximity), the repeaters 110a-f may be absent.

Furthermore, the use of the repeaters 110a-f between each connection of the MC 105 and the MMs 125a-f is only exemplary. The system 100 may include a repeater in between select connections. For example, the connections between the MMs 125a-c to the MC 105 may include the repeaters 110a-c but the connections between the MMs 125d-f to the MC 105 may not include the repeaters. It should be noted that the MC 105 may be further connected to, for example, a data collecting device (not shown) such as a computer, a motherboard, etc.

The MC 105 manages the flow of data going to and from the MMs 125a-f. The MC 105 contains the logic necessary to read and write dynamic random access memories (DRAM). The MC 105 further refreshes the DRAM by sending current through the entire memory device. Without constant refreshing performed by the MC 105, the DRAM loses the data contained therein as the capacitors of the DRAM leak current within a number of milliseconds. For example, according to the Joint Electron Device Engineering Council (JEDEC) standard, the capacitor of the DRAM leaks current in 64 milliseconds. The DRAM of the MMs 125a-f will be discussed in detail below. The MC 105 may be, for example, a double data rate (DDR) memory controller, a dual-channel memory controller, or a fully buffered memory controller. It should be noted that the use of the DRAM is only exemplary and the memory devices may also be, for example, synchronous dynamic random access memory (SDRAM), flash drives, etc.

Buffers 120a-f may be incorporated within interface boards (IB) 115a-f, respectively. The IBs 115a-f may be, for example, probe cards or device IBs (DIB). A probe card is an interface between an electronic test system such as the MC 105 and a semiconductor wafer such as the MMs 125a-f. The probe card provides an electrical path between the MC 105 and the circuits of the MMs 125a-f, thereby allowing the testing and validation of the circuits of the MMs 125a-f at the wafer level. A DIB (also known as DUT board) is a printed circuit board (PCB) and provides an interface between the integrated circuit such as the MMs 125a-f and a test head of the MC 105. DIBs are designed to meet both the mechanical and electrical requirements of the particular chip being tested and the MC 105.

The buffers 115a-f may be AMBs. Those skilled in the art will understand that the AMB may be substantially similar to an AMB that is found incorporated within a MM, such as in a fully buffered dual in-line memory module (FB-DIMM). Thus, the AMBs 115a-f of the IBs 115a-f may be a mass produced, commercially available AMB. According to the exemplary embodiments of the present invention, since the buffers 120a-f are incorporated in the IBs 115a-f, respectively, the AMB may be disposed between the MC 105 and the MMs 125a-f. Therefore, the MC 105 writing to the DRAMs of the MMs 125a-f is performed via the buffers 120a-f, respectively. The writing to the DRAMs of the MMs 125a-f may be done substantially similar to the conventional writing methods where the MMs 125a-f also include the AMB. In an embodiment where the MMs 125a-f also include the AMB, the writing may entail a further step where the MC 105 writes to the DRAMs of the MMs 125a-f first via the buffers 120a-f and then via the AMB of the MMs 125a-f. For example, if the MM 125b is a FB-DIMM, the MC 105 writes to the DRAMs of the MM 125b first via the buffer 120b of the IB 115b and then via the buffer of the MM 125b.

Unlike the parallel bus architecture of traditional DRAMs, FB-DIMM has a serial interface between the MC and the AMB. The buffers 120a-f disposed between the MC 105 and the MMs 125a-f may also exhibit the features inherent with the testing the FB-DIMM. For example, the serial interface enables an increase to the width of the memory without increasing the pin count of the MC 105 beyond a feasible level. With this architecture as discussed above, the MC 105 does not write to the memory module directly but writes via the AMB. The AMB may thus compensate for signal deterioration by buffering and resending the signal. In addition, the AMB may also offer error correction, without posing any overhead on the processor or the MC 105. The AMB may also use the Bit Lane Failover Correction feature to identify bad data paths and remove them from operation, thereby dramatically reducing command/address errors. Also, since reads and writes are buffered, they may be done in parallel by the MC 105. This allows simpler interconnects, more memory bandwidth, hardware-agnostic memory controller chips (such as DDR2 and DDR3) which can be used interchangeably, etc.

The buffers 120a-f such as the AMB are cost efficient and are easily incorporated into the system 100 through the IBs 115a-f. Therefore, testing high operating rate MMs 125a-f may be done without the difficult and expensive hardware investment conventionally required. The buffers 120a-f incorporated in the IBs 115a-f disposed between the MMs 125a-f and the MC 105 serve as satellite test site processors used in place of standard automatic pattern generators (APGs). Thus, the system 100 may exhibit a testing architecture such as a daisy architecture. It should be noted that multiple MCs may further be included in the system 100 where the multiple MCs are interconnected, thereby creating a daisy-chain architecture.

Using, for example, a JEDEC DDR interface for the IBs 115a-f, MMs 125a-f that also exhibit the JEDEC standard may be tested using the MC 105. Those skilled in the art will understand that most MMs 125a-f adhere to the JEDEC standard, particularly when the MMs 125a-f further include the AMB. Thus, the MC 105 may include a universal interface through the IBs 115a-f. As discussed above, because the architecture of DRAMs are substantially similar to flash drives, flash drives may also be tested using the JEDEC DDR interface of the system 100.

Figure 2A:
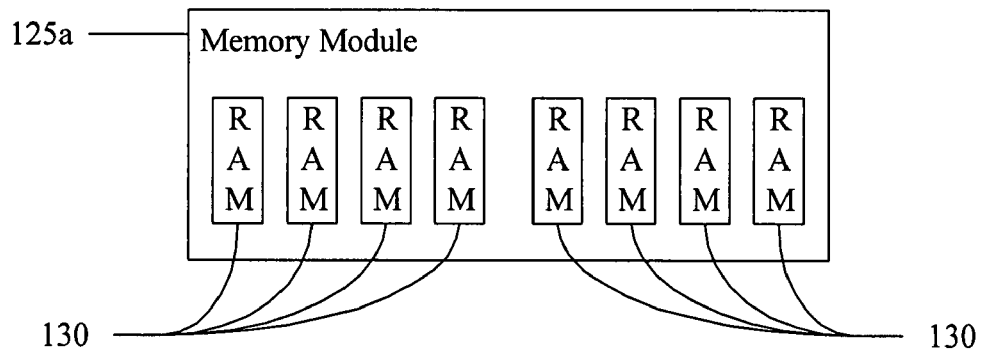
FIG. 2a shows an exemplary embodiment of a first memory module that is tested using the system of FIG. 1.
Figure 2B:
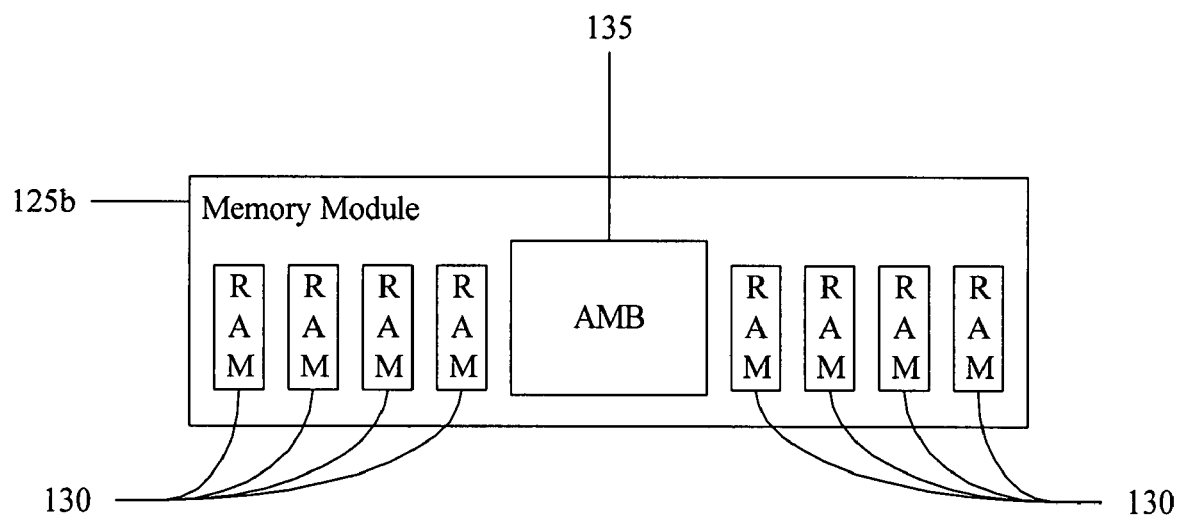
FIG. 2b shows an exemplary embodiment of a second memory module that is tested using the system of FIG. 1.

Using the MC 105 with the buffers 120a-f (e.g., AMB) serving as a logic layer, the MC 105 may be used to test the MMs 125a-f (e.g., MM with AMB, MM without AMB) without any further hardware requirements. As shown in FIGS. 2a-b, the MMs 125a-f may or may not include a separate buffer. FIG. 2a shows the MM 125a that includes a plurality of random access memories (RAM) 130. The MM 125a may be a dual in-line memory module (DIMM). Those skilled in the art will understand that DIMMs have a 64-bit data path that perform more efficient data transfers. DIMMs with increased data rates may include, for example, DDR synchronous dynamic RAM (SDRAM) which is a 184-pin DIMM, DDR2 which is a 240-pin DIMM, etc. Depending on the type of DIMM, the number of RAMs, the types of RAMs (e.g., number of pins), etc. may vary. It should be noted that the use of the DIMM is only exemplary and the present invention may be applied to any memory device/module and any variation thereof.

FIG. 2b shows the MM 125b that includes a plurality of random access memories (RAM) 130 and further includes the buffer 135 (e.g., AMB). With the inclusion of the buffer 135 such as the AMB, the MM 125b may be a FB-DIMM. When the AMB is incorporated in the MM 125b, the AMB may be disposed between the buffer 120b and the MM 125b. Thus, as discussed above, the writing to the MM 125b may be done by the MC 105 via the buffer 120b and the buffer 135. It should be noted that the use of the FB-DIMM is only exemplary and the present invention may be applied to any memory device/module including a buffer and any variation thereof.

It should be noted that the use of the MM 125a as a MM without a buffer and the MM 125b as a MM with the buffer 135 is only exemplary. The system 100 may include any permutation regarding the MMs 125a-f and whether a buffer is incorporated in each. For example, the MMs 125a-c may be MMs with no buffer (e.g., DIMM) while MMs 125d-f may be MMs with the buffer 135 (e.g., FB-DIMM).

Figure 3:
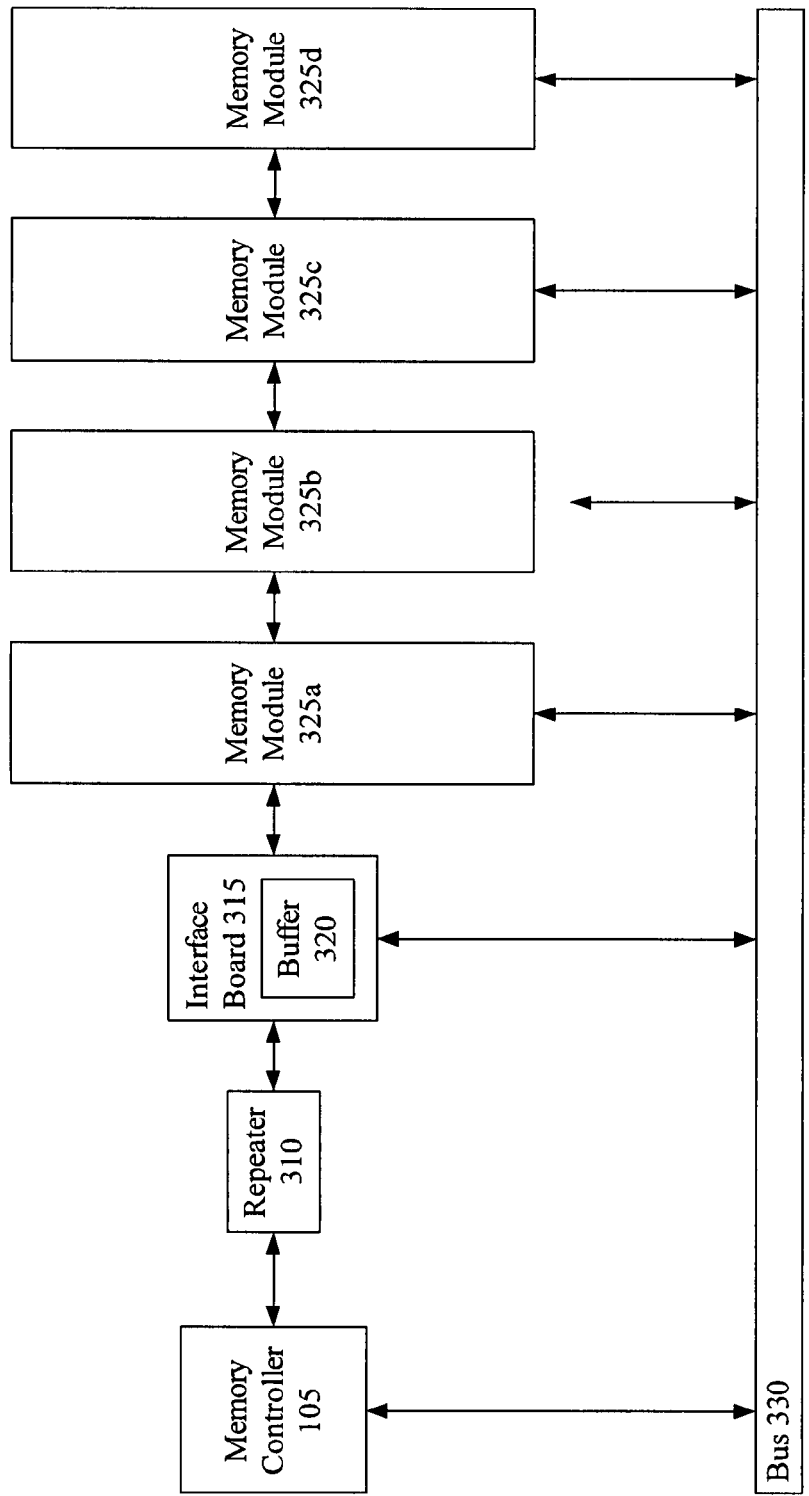
FIG. 3 shows a second exemplary embodiment of a system according to the present invention.

FIG. 3 shows a second exemplary embodiment of a system 300 for performing an electronic test of memory devices according to the present invention. The system 300 may include the MC 105, a repeater 310, an IB 315, a buffer 320, MMs 325a-d, and a bus 330. The MC 105 functions substantially similar to the MC 105 described with reference to the system 100 of FIG. 1.

The repeater 310 functions substantially similar to any of the repeaters 110a-f described with reference to the system 100 of FIG. 1. The repeater 310 may be more appropriate when the testing device exhibits the architecture shown in FIG. 3. That is, the MMs 325a-d may be disposed at a distance far enough that signal amplification may be necessary. For example, the MM 325d is disposed at the furthest location from the MC 105 and signals to be transmitted and/or received by the MC 105 may require the amplification.

As described above with reference to the IBs 115a-f of the system 1 of FIG. 1, the IB 315 provides the electrical connection between the MC 105 and the MMs 325a-d. The IB 315 may also be, for example, a probe card or DIB. As illustrated in the system 300, the IB 315 may be connected to the MM 325a. However, it should be noted that the IB connecting to only the MM 325a is only exemplary and the IB 315 may include further connection sites to couple with the other MMs 325b-d. In addition, similar to the system 100, the system 300 incorporates the buffer 320 in the IB 315. That is, the buffer 320 is disposed between the MC 105 and the MMs 325a-d. Therefore, the MC 105 writes to the MMs 325a-d indirectly through the buffer 320.

The bus 330 may be a subsystem that transfers data and/or power between components such as the MC 105, the IB 315, and the MMs 325a-d. In contrast to a point-to-point (P2P) architecture, the bus 330 may logically connect several peripherals (e.g., MMs 325a-d) over a common set of wires. The bus 330 may further assist in the testing capabilities of the MC 105. Utilizing a bus 330, the repeater 310 may be unnecessary as data transfers such as the signals transmitted/received from the MC 105 may be accomplished via the bus 330. However, it should be noted that the use of the bus 330 is only exemplary. The system 300 may exhibit an architecture where the bus 330 is absent. For example, the repeater may be present to ensure that the signals from the MC 105 are received by all the MMs 325a-d. It should further be noted that the bus 330 may be included, although not necessary, in the system 100 of FIG. 1.

In contrast to the system 100 of FIG. 1, the system 300 of FIG. 3 includes the MMs 325a-d in a different testing architecture. The system 300 may exhibit a linear architecture where the MMs 325a-d are connected serially, where MM 325a is closest to the MC 105 and 325d is furthest from the MC 105. Using, for example, memory channels, the MMs 325a-d may be connected serially. Thus, the MC 105 may test the multiple MMs 325a-d through a single connection, in contrast to the MC 105 of the system 100 where the MC 105 connects to the multiple MMs 125a-f individually. The testing architecture of the system 300 also provides the advantages of using the buffer 320 such as the AMB. The advantages of the AMB described above with reference to the system 100 disposed between the MC 105 and the MMs 325a-d may be realized in this embodiment as well.

Figure 4:
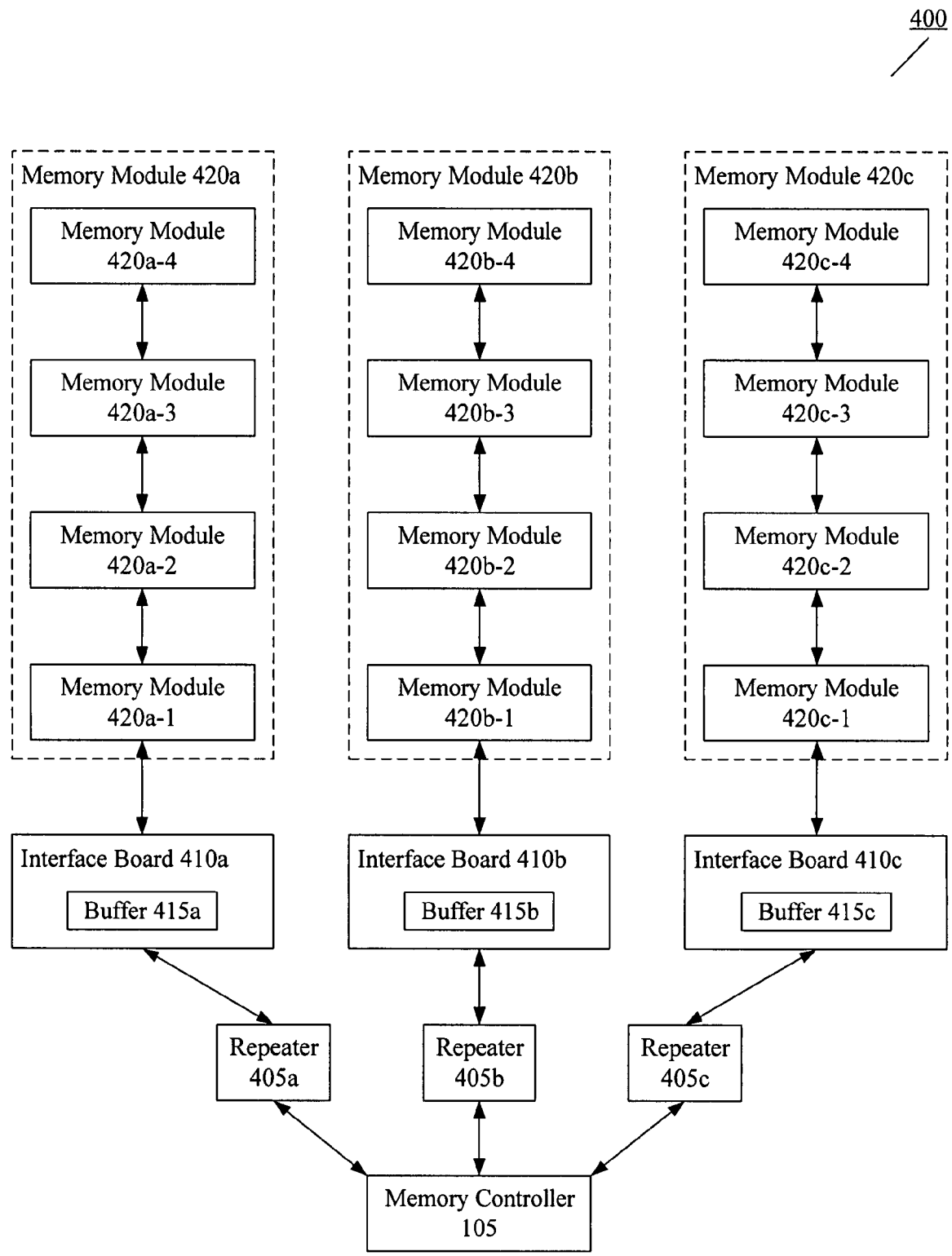
FIG. 4 shows a third exemplary embodiment of a system according to the present invention.

The present invention may also incorporate the testing architectures described with reference to the system 100 and the system 300. That is, the testing architecture may exhibit a daisy architecture where each daisy further exhibits linear extensions. FIG. 4 shows a third exemplary embodiment of a system 400 according to the present invention. The system 400 may be seen as including the daisy architecture where the MC 105 is connected to each of the MM groups 420a-c via the IBs 410a-c and the buffers 415a-c, respectively. Again, it is noted that the use of the repeaters 405a-c is only exemplary and the system 400 may not include the repeaters. The system 400 may also be seen as including the linear architecture where the MC 105 is connected to a particular MM group (e.g., MM group 420a includes MMs 420a-1-4; MM group 420b includes MMs 420b-1-4; MM group 420c includes MMs 420c-1-4). For example, the MC 105 is connected to the MM group 420a consisting of MMs 420a-1-4 via the IB 410a and the buffer 415a. Again, it is noted that the system 400 may also include a buffer (not shown). Thus, the combination architecture may also be utilized with the present invention since the buffer is still disposed between the MC 10 and the MMs.

Figure 5:
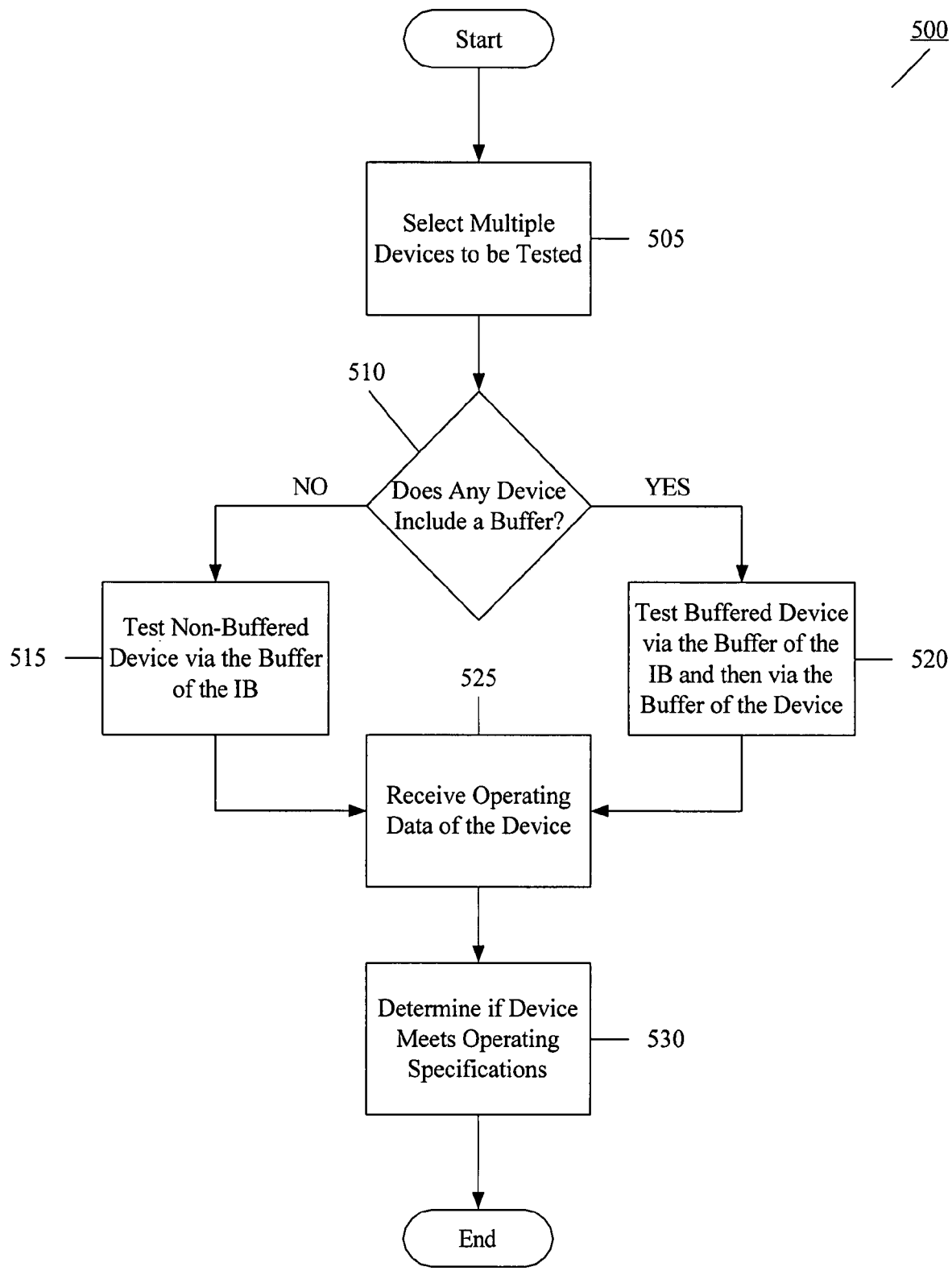
FIG. 5 shows an exemplary embodiment of a method according to the present invention.

FIG. 5 shows an exemplary embodiment of a method 500 according to the present invention. The method 500 will be described with reference to the system 100 of FIG. 1, the system 300 of FIG. 3, and the MMs 125a-b of FIGS. 2a-b. As will be discussed below, the method 500 may be utilized to test a DUT (e.g., MM 125a) using a single testing device (e.g., MC 105) that requires no further hardware regardless of the operating speed of the DUT.

The method 500 begins at step 505 when multiple DUTs are selected. The DUT may be, for example, the MMs 125a-f. Furthermore, the MMs 125a-f may be either the MM 125a which only includes DRAMs, the MM 125b which includes DRAMs and a buffer such as the AMB, or any combination thereof. At step 510, a determination is made whether any of the selected DUTs include the buffer. That is, step 510 determines whether any of the selected DUTs is MM 125b.

If the step 510 determines that a buffer is not present, the method continues to step 515 where the non-buffered DUT (e.g., MM 125a) is tested by the MC 105 via the buffer of the IB (e.g., buffer 120a of system 100, buffer 320 of system 300). Upon writing (e.g., transmitting data signals) to the non-buffered MM, reading and/or writing data may be ascertained to determine operating data of the DUT. If the step 510 determines that a buffer is present, the method continues to step 520 where the DUT is tested by the MC 105 via the buffer of the IB and the buffer of the MM. For example, the MC 105 writes to the DRAMs of the MM 125b indirectly through both the buffer 10b and the buffer 135. Upon writing to the buffered MM, reading and/or writing data may be ascertained to determine the operating data of the DUT. Upon testing in either step 515 or 520, the MC 105 receives the operating data of the MM in step 525. Upon receiving the operating data, in step 530, a determination is made whether the MM meets operating specifications.

AMB logic devices offer faster SDRAM speeds and wide read/write buses at the most current speeds. As discussed above, the AMB is cost efficient and easily incorporated into the testing systems. An additional feature of the AMB is the elimination of non-recurring expenditures that are conventionally necessary. Conventional testing devices require the further hardware to test high operating rate memory devices. With varying high operating rates, the further hardware is specifically altered with each device to be tested. That is, the conventional testing devices with further hardware are not scaling to the different operating rates. For example, application specific integrated circuits (ASIC) or a field programmable gate array (FPGA) may be used. However, the AMB disposed between the MC 105 and the MM to be tested allows the single testing device to perform the tests independent of the operating rate of the memory device. Furthermore, the testing architectures described above allow optimization of test time within a cost of an IB. For example, conventionally, testing devices for multiple DUTs must be altered to adapt to the type of DUT to be tested. Additionally, common functionality DUTs (e.g., DUTs all contain buffer, DUTs all lack buffer) are tested concurrently. The present invention allows for testing of any combination of DUTs without any need for hardware adaptations.

As discussed above, the IBs may utilize the JEDEC DDR interface. The JEDEC standard further allows for an AMB memory built in self test (MBIST) or an AMB logic built in self test (IBIST). Furthermore, the AMB disposed between the MC 105 and the MM to be tested and utilizing the JEDEC standard allow for AMB MBIST functions to be improved with reprogrammable APG architectures. With the increased operating rates of the memory devices, various APG architectures may be used to measure the different combinatorial and sequential circuits. For example, with the AMB, the MC 105 may perform a D-Algorithm APG, Path Oriented Decision Making APG, Fan-Out Oriented APG, etc.

The AMB may be further used to allow the testing systems to be composed of switched AMB point to point (P2P) buses for fast error readback. The P2P architecture may also allow for a more cost efficient serial peripheral interface (SPI) for highest fanout at lower cost.

It will be apparent to those skilled in the art that various modifications may be made in the present invention, without departing from the spirit or scope of the invention. Thus, it is intended that the present invention cover the modifications and variations of this invention provided they come within the scope of the appended claims and their equivalents.

What is claimed is:

1. A testing device, comprising:
    a memory controller managing a transfer of data; and
    a plurality of interface boards, each interface board including a controller buffer, each controller buffer transferring data between the memory controller and at least one memory module, each controller buffer is connected to the memory controller independently of the other controller buffers,
        wherein the memory controller tests the at least one memory module, the testing device operable to test the at least one memory module independent of an operating rate of the at least one memory module, the memory controller receiving operating data of the at least one memory module, each memory module is connected to only one of the controller buffers.

2. The testing device of claim 1, wherein the controller buffer is an advanced memory buffer.

3. The testing device of claim 1, wherein the at least one memory module includes a plurality of memory modules.

4. The testing device of claim 3, wherein the plurality of memory modules exhibits one of a daisy architecture and a serially linear architecture.

5. The testing device of claim 1, being configured to test the at least one memory module including a plurality of dynamic access memories.

6. The testing device of claim 1, being configured to test the at least one at least one memory module including a memory buffer.

7. The testing device of claim 6, wherein the memory buffer is an advanced memory buffer.

8. The testing device of claim 6, wherein the at least one memory module is a fully-buffered dual in-line memory module.

9. The testing device of claim 6, wherein the memory controller writes to the at least one memory module through the controller buffer and the memory buffer.

10. The testing device of claim 1, further comprising:
    a repeater disposed between the memory controller and the at least one memory module to amplify signals carrying the data.

11. A method, comprising:
    generating, by a memory controller, a set of test data;
    transferring, by the memory controller, the set of data to a plurality of interface boards, each interface board including a controller buffer, each controller buffer is connected to the memory controller independently of the other controller buffers;
    transferring, by the controller buffers, the set of data to at least one memory module connected to each interface board, wherein the controller buffer operates independent of an operating rate of the at least one memory module, each memory module is connected to only one of the controller buffers; and
    receiving operating data of the at least one memory module in response to the set of test data.

12. The method of claim 11, wherein the controller buffer is an advanced memory buffer.

13. The method of claim 11, wherein the at least one memory module includes a plurality of memory modules.

14. The method of claim 13, wherein the plurality of memory modules exhibits one of a daisy architecture and a serially linear architecture.

15. The method of claim 11, wherein the at least one memory module includes a plurality of dynamic access memories.

16. The method of claim 11, wherein the at least one memory module includes a memory buffer.

17. The method of claim 16, wherein the memory buffer is an advanced memory buffer.

18. The method of claim 16, wherein the at least one memory module is a fully-buffered dual in-line memory module.

19. The method of claim 11, further comprising: amplifying signals corresponding to the transfer of data through a repeater disposed between the memory controller and the at least one memory module.

20. A testing device, comprising:
    a memory controller managing a transfer of data; and
    a plurality of connection means, each connection mean including a buffering means, each buffering means transferring data between the memory controller and at least one memory module, each buffering means is connected to the memory controller independently of the other buffering means,
        wherein the memory controller tests the at least one memory module, the testing device operable to test the at least one memory module independent of an operating rate of the at least one memory module, the memory controller receiving operating data of the at least one memory module, each memory module is connected to only one of the buffering means.

* * * * *